United States Patent
Wang et al.

(10) Patent No.: US 10,868,087 B2
(45) Date of Patent: Dec. 15, 2020

(54) METHOD FOR MANUFACTURING A CATHODE ISOLATION RETAINING WALL, A DISPLAY PANEL AND MANUFACTURING METHOD THEREOF

(71) Applicant: BOE TECHNOLOGY GROUP CO., LTD., Beijing (CN)

(72) Inventors: Zhi Wang, Beijing (CN); Shengji Yang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 124 days.

(21) Appl. No.: 16/130,156

(22) Filed: Sep. 13, 2018

(65) Prior Publication Data

US 2019/0148461 A1 May 16, 2019

(30) Foreign Application Priority Data

Nov. 14, 2017 (CN) .......................... 2017 1 1124090

(51) Int. Cl.
| | | |
|---|---|---|
| *H01L 27/32* | (2006.01) | |
| *H01L 51/52* | (2006.01) | |
| *G06F 3/041* | (2006.01) | |
| *H01L 51/56* | (2006.01) | |
| *G06F 3/044* | (2006.01) | |

(52) U.S. Cl.
CPC .......... *H01L 27/323* (2013.01); *G06F 3/0412* (2013.01); *H01L 27/3246* (2013.01); *H01L 27/3283* (2013.01); *H01L 51/5221* (2013.01); *H01L 51/5256* (2013.01); *H01L 51/56* (2013.01); *G06F 3/0443* (2019.05)

(58) Field of Classification Search
CPC .................................................... G06F 3/0443
See application file for complete search history.

(56) References Cited

FOREIGN PATENT DOCUMENTS

| CN | 1416300 A | 5/2003 |
|---|---|---|
| CN | 101740726 A | 6/2010 |
| CN | 101800293 A | 8/2010 |
| CN | 104076966 A | 10/2014 |
| CN | 104600206 A | 5/2015 |
| CN | 105470284 A | 4/2016 |
| CN | 106486604 A | 3/2017 |
| CN | 206250196 U | 6/2017 |

OTHER PUBLICATIONS

Chinese Office Action dated Oct. 24, 2019, from application No. 201711124090.5.

*Primary Examiner* — Gustavo Polo
(74) *Attorney, Agent, or Firm* — Thomas | Horstemeyer LLP

(57) ABSTRACT

The disclosure provides a method for manufacturing cathode isolation retaining walls, display panel and manufacturing method thereof. A method for manufacturing a cathode isolation retaining wall, including exposing a first photoresist layer formed on an anode layer to obtain a first isolation retaining wall portion. The method includes forming a second photoresist layer on a side of the first photoresist layer away from the anode layer. After exposing the second photoresist layer, a second isolation retaining wall portion at least partially stacked with the first isolation retaining wall portion is obtained. The method includes developing the first photoresist layer and the second photoresist layer to obtain a cathode isolation retaining wall composed of the first isolation retaining wall portion and the second isolation retaining wall portion.

20 Claims, 3 Drawing Sheets

METHOD FOR MANUFACTURING A CATHODE ISOLATION RETAINING WALL, A DISPLAY PANEL AND MANUFACTURING METHOD THEREOF

CROSS REFERENCE

This application is based upon and claims priority to Chinese Patent Application No. 201711124090.5, filed on Nov. 14, 2017, the entire contents thereof are incorporated herein by reference.

TECHNICAL FIELD

The present disclosure relates to a technical field of photolithography processes, and in particular, to a method for manufacturing a cathode isolation retaining wall, a display panel and manufacturing method thereof.

BACKGROUND

At present, in the manufacturing process of the display panel, an array process is generally used to form a patterned array on the base substrate to obtain a display panel. There are many types of these display panels, such as thin film transistor array panels, organic light emitting diode array panels, and the like.

In the manufacturing process of the organic light emitting diode array panel, an anode layer, a cathode strip and a cathode isolation retaining wall for isolating the adjacent two cathode strips are required to be prepared on the base substrate. In the related art, the positive photoresist is usually exposed by photolithography process to form a cathode isolation retaining wall with a cross section shape of trapezoid as shown in FIG. 1. This is because when light propagates from the top of the photoresist to the bottom of the photoresist, it is gradually absorbed, which results in insufficient light intensity at the bottom of the photoresist, and thus forming a trapezoidal shape as shown in FIG. 1. With such a narrow top and wide bottom trapezoidal shaped cathode isolation retaining wall, effective is not possible. During the vapor deposition process of the cathode layer, the cathode layer will be formed on the anode layer and on the cathode isolation retaining wall, as an integrally formed cathode structure, which can't be separated into a plurality of cathode strips, and thus the cathode patterning effects will be poor.

In the related art, a negative photoresist can be used to form an inverted trapezoidal cathode isolation retaining wall, that is, a wide top and narrow bottom trapezoidal shape. However, since the negative photoresist is rarely used in the mass production line, the method is difficult to be applied in mass-production, and thus the cost will be high.

SUMMARY

In one aspect of the present disclosure, a display panel is provided. The display panel includes an anode layer and a plurality of cathode isolation retaining walls. Each of the cathode isolation retaining walls includes a first isolation retaining wall portion and a second isolation retaining wall portion stacked on the top of the first isolation retaining wall portion. The first isolation retaining wall portion is disposed on the anode layer, and the second isolation retaining wall portion is disposed on a side of the first isolation retaining wall portion away from the anode layer. The first isolation retaining wall portion includes a first top surface attaching to the second isolation retaining wall portion and a first bottom surface attaching to the anode layer. The second isolation retaining wall portion includes a second bottom surface attaching to the first isolation retaining wall portion and a second top surface. The orthographic projection of the first top surface on the anode layer falls within the orthographic projection of the second bottom surface on the anode layer.

According to one implementation of the present disclosure, the first isolation retaining wall portion and the second isolation retaining wall portion include positive photoresist.

According to one implementation of the present disclosure, an area of the first top surface is smaller than that of the first bottom surface, and an area of the second top surface is smaller than that of the second bottom surface.

According to one implementation of the present disclosure, the height of the first isolation retaining wall portion is greater than the height of the second isolation retaining wall portion.

According to one implementation of the present disclosure, there is a gap between two adjacent cathode isolation retaining walls. A first organic functional layer and a first cathode layer are sequentially disposed on each of the cathode isolation retaining walls. A second organic functional layer and a second cathode layer are sequentially laid on the anode layer region between two adjacent cathode isolation retaining walls. The adjacent first cathode layer and the second cathode layer are separated from each other.

According to one implementation of the present disclosure, a plurality of the second cathode layers respectively correspond to a plurality of positions of the display panel, and the plurality of the second cathode layers are used for loading a touch signal.

In another aspect, an arrangement of the present disclosure provides a method for manufacturing a cathode isolation retaining wall. The method includes exposing a first photoresist layer formed on an anode layer to obtain a plurality of first isolation retaining wall portions. The method includes forming a second photoresist layer on a side of the first photoresist layer away from the anode layer and exposing the second photoresist layer to obtain a plurality of second isolation retaining wall portions. Each of the plurality of second isolation retaining wall portions respectively is at least partially stacked with one of the plurality of first isolation retaining wall portions. Each of the plurality of first isolation retaining wall portions includes a first top surface attaching to the second isolation retaining wall portion and a first bottom surface attaching to the anode layer. Each of the plurality of second isolation retaining wall portions includes a second bottom surface attaching to the first isolation retaining wall portion and a second top surface. The orthographic projection of the first top surface on the anode layer falls within the orthographic projection of the second bottom surface on the anode layer The method includes developing the first photoresist layer and the second photoresist layer to obtain a plurality of cathode isolation retaining walls. Each of the plurality of cathode isolation retaining walls includes a first isolation retaining wall portion and a second isolation retaining wall portion.

According to one implementation of the present disclosure, the first photoresist layer and the second photoresist layer are both positive photoresist.

According to one implementation of the present disclosure, an area of the first top surface is smaller than that of the first bottom surface, and an area of the second top surface is smaller than that of the second bottom surface.

According to one implementation of the present disclosure, the height of the first isolation retaining wall portion is greater than the height of the second isolation retaining wall portion.

According to one implementation of the present disclosure, the first isolation retaining wall portion has a height of 1-2 μm, and the second isolation retaining wall portion has a height of 0.5-1 μm.

According to one implementation of the present disclosure, the first bottom surface of the first isolation retaining wall portion has a width of 4-8 μm, and the second bottom surface of the second isolation retaining wall portion has a width of 6-10 μm.

In still another aspect, the arrangement of the present disclosure further provides a method for manufacturing a display panel. The method includes exposing the first photoresist layer formed on the anode layer to obtain a plurality of first isolation retaining wall portions. The method includes forming a second photoresist layer on a side of the first photoresist layer away from the anode layer, and exposing the second photoresist layer to obtain a plurality of second isolation retaining wall portions. Each of the plurality of second isolation retaining wall portions respectively is at least partially stacked with one of the plurality of first isolation retaining wall portions. Each of the plurality of first isolation retaining wall portions includes a first top surface attaching to the second isolation retaining wall portion and a first bottom surface attaching to the anode layer. Each of the plurality of second isolation retaining wall portions includes a second bottom surface attaching to the first insulation retaining wall portion and a second top surface. The orthographic projection of the first top surface on the anode layer falls within the orthographic projection of the second bottom surface on the anode layer. The method includes developing the first photoresist layer and the second photoresist layer to obtain a cathode isolation retaining wall composed of the first isolation retaining wall portion and the second isolation retaining wall portion.

According to one implementation of the present disclosure, the first photoresist layer and the second photoresist layer are both positive photoresist.

According to one implementation of the present disclosure, an area of the first top surface is smaller than that of the first bottom surface, and an area of the second top surface is smaller than that of the second bottom surface.

According to one implementation of the present disclosure, the height of the first isolation retaining wall portion is greater than the height of the second isolation retaining wall portion.

According to one implementation of the present disclosure, the first isolation retaining wall portion has a height of 1-2 μm, and the second isolation retaining wall portion has a height of 0.5-1 μm.

According to one implementation of the present disclosure, the first bottom surface of the first isolation retaining wall portion has a width of 4-8 μm, and the second bottom surface of the second isolation retaining wall portion has a width of 6-10 μm.

DETAILED DESCRIPTION

In order to further explain the technical means and effectiveness of the disclosure for achieving a predetermined purpose, the specific arrangements, structures, features and functions of the method for manufacturing a cathode isolation retaining wall according to the present disclosure will be described in below with reference to the accompanying drawings and preferred arrangements.

Figure 1:
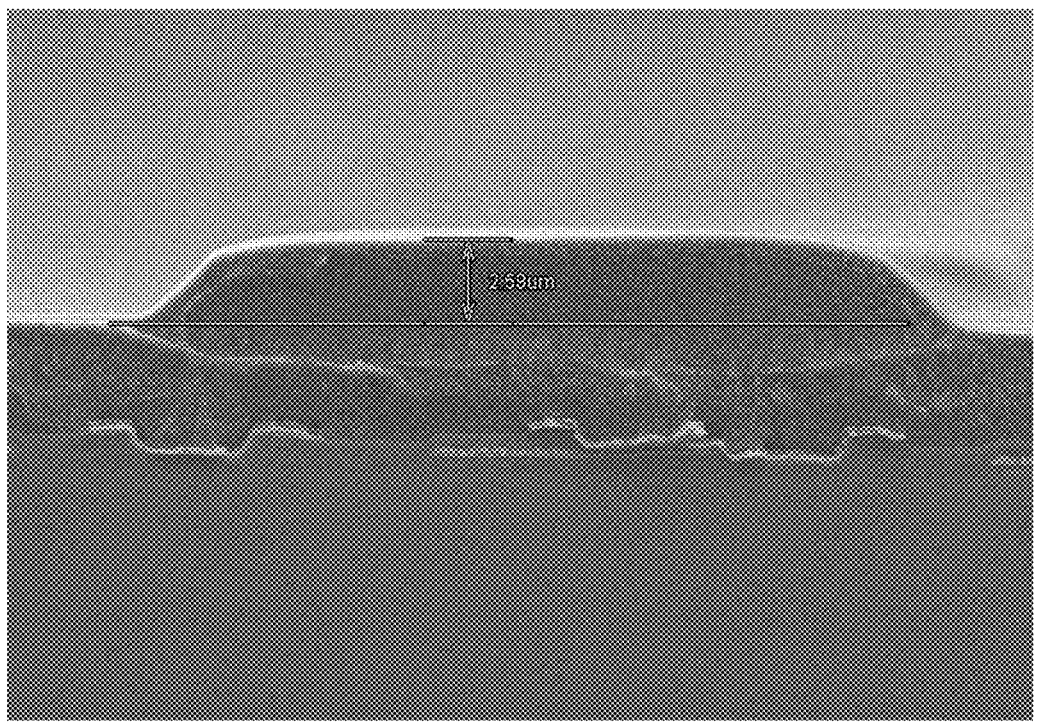
FIG. 1 is a schematic structure view of a cathode isolation retaining wall in the related art.
Figure 2:
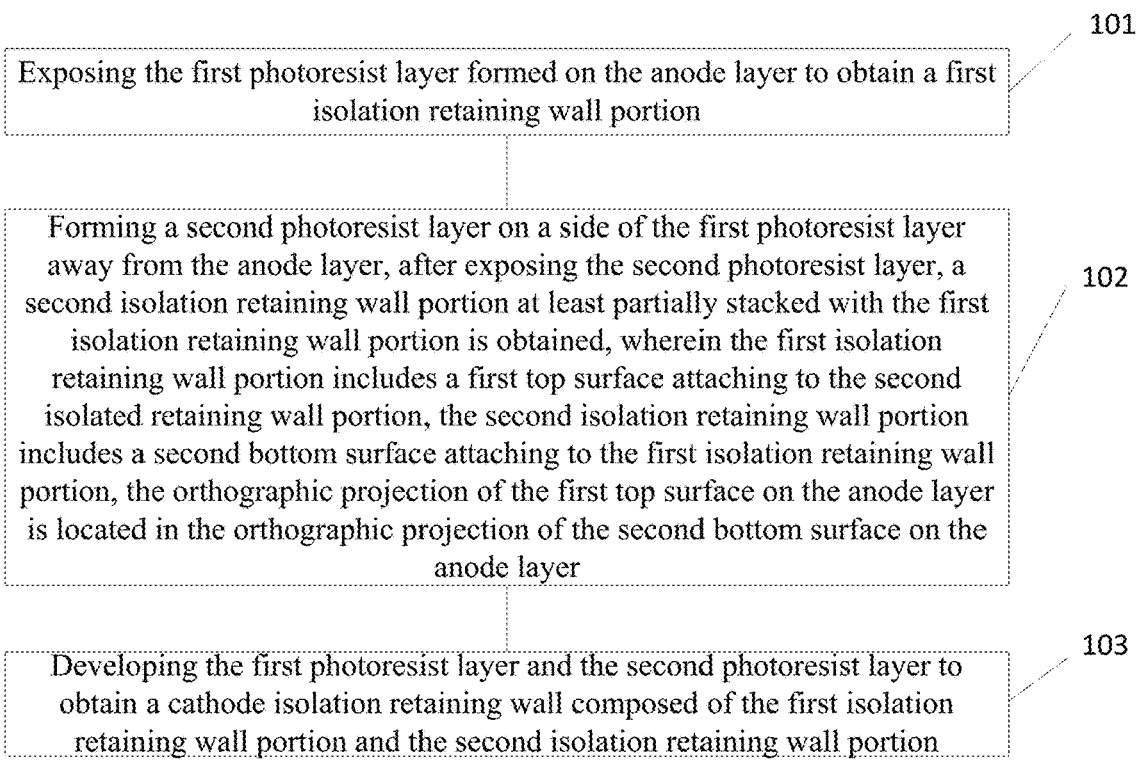
FIG. 2 is a schematic flowchart of a method for manufacturing the cathode isolation retaining wall provided by one arrangement of the present disclosure.

As shown in FIG. 2, a method for manufacturing a cathode isolation retaining wall provided by an arrangement of the present disclosure includes the following.

Figure 3:
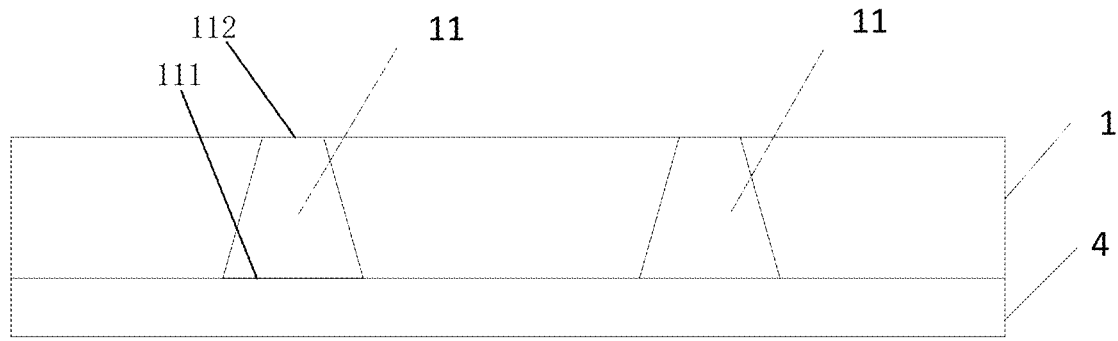
FIG. 3 is a schematic structure view of 101 of the method for manufacturing a cathode isolation retaining wall in FIG. 2.

In 101, as shown in FIG. 3, the first photoresist layer 1 formed on the anode layer 4 is exposed to obtain a first isolation retaining wall portion 11. In the exposure process, the first photoresist layer 1 may be irradiated by a mercury arc lamp or other radiation source through a mask plate. The mask plate has a light-transmitting region and a light-shielding region having a predetermined shape patterns. When the light is irradiated on the mask plate, the light irradiated in the light-transmitting region can be irradiated onto the first photoresist layer 1 through the mask plate, the light irradiated in the light-shielding region will be absorbed by the mask plate and will not pass through the mask plate, the pattern area exposed on the first photoresist layer 1 can be defined by the mask plate to obtain the first isolation retaining wall portion 11 with a predetermined shape.

In 101, the first photoresist layer 1 can be made of photoresist material, a photoresist is a photosensitive material and changes its solubility after being exposed to light. After being irradiated, the illuminated portion of the positive photoresist becomes easily dissolved. On the contrary, the illuminated portion of the negative photoresist becomes hard to be dissolved. In the arrangement, the photoresist in the first photoresist layer 1 is a positive photoresist and the first photoresist layer 1 is exposed according a preset shape image. The exposed portion of the first photoresist layer 1 becomes easily dissolved, and the unexposed portion of the first photoresist layer 1 forms a first isolation retaining wall portion 11 which is not easily dissolved. The first isolation retaining wall portion 11 includes a first bottom surface 111 adjacent to the anode layer 4 and a first top surface 112 away from the anode layer 4. The orthographic projection of the first top surface 112 on the anode layer 4 falls within the orthographic projection of the first bottom surface 111 on the anode layer 4.

Figure 4:
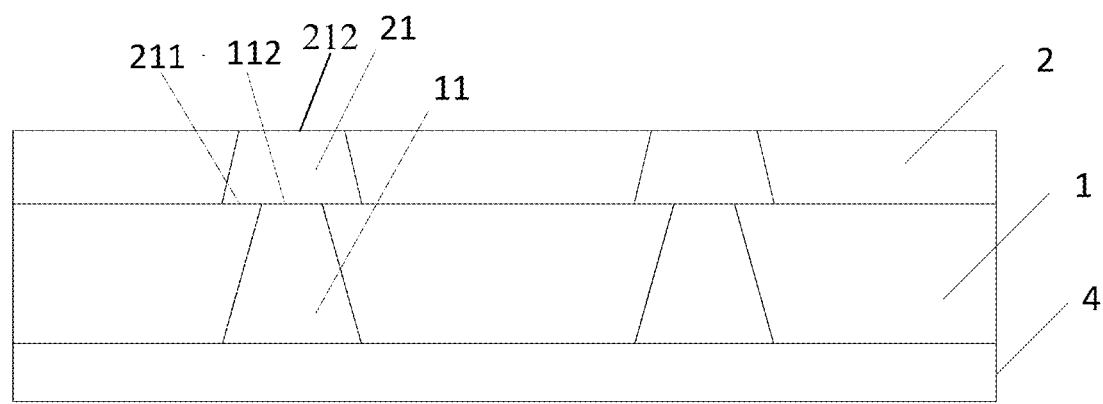
FIG. 4 is a schematic structure view of 102 of the method for manufacturing a cathode isolation retaining wall in FIG. 2.

In 102, as shown in FIG. 4, a second photoresist layer 2 is formed on a side of the first photoresist layer 1 away from the anode layer 4. After exposing the second photoresist layer 2, a second isolation retaining wall portion 21 at least partially stacked on top of the first isolation retaining wall portion 11 is obtained. The first isolation retaining wall portion 11 includes a first top surface 112 attaching to the second isolation retaining wall portion 21, the second isolation retaining wall portion 21 includes a second bottom surface 211 attaching to the first isolation retaining wall portion 11, and the orthographic projection of the first top surface 112 on the anode layer 4 falls within the orthographic projection of the second bottom surface 211 on the anode layer 4. In addition, the second isolation retaining wall portion 21 includes a second top surface 212 away from the second isolation retaining wall portion, and the orthographic projection of the second top surface 212 on the anode layer 4 falls within the orthographic projection of the second bottom surface 211 on the anode layer 4. In one arrangement, the first top surface 112, the first bottom surface 111, the second top surface 212 and the second bottom surface 211 may be parallel to each other and parallel to the anode layer 4.

In 102, the second photoresist layer 2 is formed on the first photoresist layer 1, which is often formed by an applying process. That is, a photoresist is applied on the first photoresist layer 1 to form a second photoresist layer 2. After the second photoresist layer 2 is formed on the first photoresist layer 1, the second photoresist layer 2 is also exposed to the exposure process. In the exposure process, the second photoresist layer 2 may also be irradiated by a mercury arc lamp or other radiation source through a mask. Since the manner of the exposure process has been described in 101, it will be not be described repeatedly here. A second isolation retaining wall portion 21 which is not easily dissolved can be formed on the second photoresist layer 2 by an exposure process.

Figure 5:
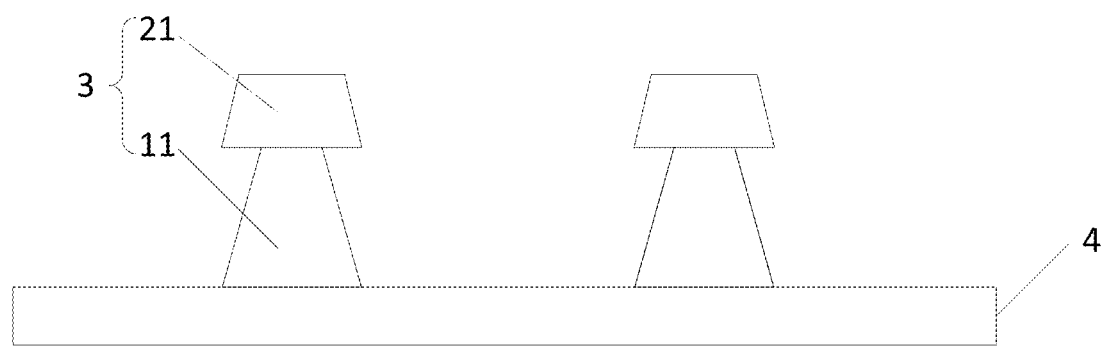
FIG. 5 is a schematic structure view of 103 of the method for manufacturing a cathode isolation retaining wall in FIG. 2.

In 103, as shown in FIG. 5, the first photoresist layer 1 and the second photoresist layer 2 is developed to obtain a cathode isolation retaining wall 3, which is composed of the first isolation retaining wall portion 11 and the second isolation retaining wall portion 21.

In 103, the developing process is used to dissolve the unnecessary photoresist in the first photoresist layer 1 and the second photoresist layer 2 by using a developing solution, and transfer the pattern on the mask plate onto the first photoresist layer 1 and the second photoresist layer 2. In this arrangement, the portion which is easily dissolved after exposure of the first photoresist layer 1 and the second photoresist layer 2 can be dissolved by the developing solution. However, the first isolation retaining wall portion 11 of the first photoresist layer 1 and the second isolation retaining wall portion 21 of the second photoresist layer 2 are not easily dissolved, and therefore, the cathode isolation retaining wall 3 is formed.

An arrangement of the present disclosure provides a method for manufacturing a cathode isolation retaining wall, to enable the cathode layer portion evaporated on the cathode isolation retaining wall and the cathode layer portion evaporated on the anode layer to be separated from each other, thus improving the cathode patterning effect. The above mentioned method for manufacturing cathode isolation retaining wall includes: firstly, exposing the first photoresist layer formed on the anode layer to obtain a first isolation retaining wall portion; secondly, forming a second photoresist layer on a side of the first photoresist layer away from the anode layer, after exposing the second photoresist layer, a second isolation retaining wall portion at least partially stacked with the first isolation retaining wall portion is obtained. The first isolation retaining wall portion includes a first top surface attaching to the second isolation retaining wall portion, the second isolation retaining wall portion includes a second bottom surface attaching to the first isolation retaining wall portion, the orthographic projection of the first top surface on the anode layer falls within the orthographic projection of the second bottom surface on the anode layer; lastly, developing the first photoresist layer and the second photoresist layer to obtain a cathode isolation retaining wall composed of the first isolation retaining wall portion and the second isolation retaining wall portion. According to the above, when the cathode layer is evaporated, a portion of the cathode layer may be formed on the anode layer between the adjacent two cathode isolation retaining walls, another portion of the cathode layer may be formed on the second isolation retaining wall portion, since the orthographic projection of the first top surface first isolation retaining wall portion on the anode layer falls within the orthographic projection of the second bottom surface of the second isolation retaining wall portion on the anode layer, therefore, in the height direction of the cathode isolation retaining wall, the second isolation retaining wall portion partially blocks the first isolation retaining wall portion, moreover, since the thickness of the cathode layer is smaller than the height of the first isolation retaining wall portion, the cathode layers of above two portions can't be continuously formed during the vapor deposition process, thus causing the cathode layer on the cathode isolation retaining wall and the cathode layer on the anode layer are separated and disconnected from each other, when different voltages are respectively input to the cathode layer portions separated and disconnected from each other, different display brightness can be formed at corresponding positions of the display panel, and the cathode patterning effect is improved.

According to one implementation of the present disclosure, the first photoresist layer 1 and the second photoresist layer 2 are both positive photoresist layers. In this arrangement, the positive photoresist layer is composed of a positive photoresist, after the positive photoresist is exposed, the exposed portion becomes easily dissolved, the photoresist layer that is exposed after development will be dissolved, only leaving the illuminated portion to form the first isolation retaining wall portion 11 and the second isolation retaining wall portion 21. When compared with the negative photoresist, the positive photoresist can make the display resolution higher because it is not easy to expand after absorbing the developer. In addition, since the negative photoresist is used less on the production line and the cost is relatively high, the use of the positive photoresist can not only make the process connection on the production line better, but also reduce the cost.

According to one implementation of the present disclosure, as shown in FIG. 5, the height of the first isolation retaining wall portion 11 is greater than the height of the second isolation retaining wall portion 12. In this arrangement, in the process of the photolithography process, the first photoresist layer 1 is disposed on the lower side, and the second photoresist layer 2 is disposed on the upper side of the first photoresist layer 1. After the first photoresist layer 1 and the second photoresist layer 2 are exposed and developed, the formed second isolation retaining wall portion 21 is also disposed on the upper side of the first isolation retaining wall portion 11. Moreover, since the first isolation retaining wall portion 11 is made of photoresist material which is soft, in order to prevent the second isolation retaining wall portion 21 from causing squeezing deformation of the first isolation retaining wall portion 11 under the influence of gravity, the height of the second isolation retaining wall portion 21 can be appropriately reduced so that the height of the second isolation retaining wall portion 21 is smaller than the height of the first isolation retaining wall portion 11. Further, the weight of the second isolation retaining wall portion 21 may be reduced, so as to reduce the deformation of the first isolation retaining wall portion 11. In one arrangement, the first isolation retaining wall 11 portion has a height of 1-21 μm, and the second isolation retaining wall portion 21 has a height of 0.5-1 μm, the first bottom surface 12 of the first isolation retaining wall portion 11 has a width of 4-8 μm, and the second bottom surface 22 of the second isolation retaining wall portion 21 has a width of 6-10 μm.

According to one implementation of the present disclosure, as shown in FIG. 3, before exposing the first photoresist layer 1 to obtain the first isolation retaining wall portion 11, the method further includes: forming a first photoresist layer 1 on one side of the anode layer 4. In this arrangement, the above photolithography process is applied to the light emitting layer of the display panel. The cathode isolation retaining wall 3 is disposed on the anode layer 4, before applying the cathode layer, an organic functional layer needs to be evaporated on the anode layer 4, so that the organic functional layer is disposed between the anode layer 4 and the cathode layer, when the anode layer and the cathode layer are energized, the organic functional layer can realize the light-emitting function.

According to one implementation of the present disclosure, after the first photoresist layer 1 is applied to one side of the anode layer 4, the method further includes: performing a first pre-bake heating on the first photoresist layer 1. In this arrangement, most of the solvent in the first photoresist layer 1 can be removed by the first pre-bake heating, then the adhesion of the photoresist in the first photoresist layer 1 is improved, and the exposure characteristics of the photoresist is fixed. The method of pre-baking process can use infrared radiation, oven, hot plate, etc., the pre-baking time can be controlled between 50 seconds to 70 seconds, in one arrangement, the heating temperature of the first pre-bake heating is 100-130 degrees to ensure the purpose of the first pre-bake heating.

According to one implementation of the present disclosure, after forming a second photoresist layer 2 on a side of the first photoresist layer 1, the method further includes: performing a second pre-bake heating on the second photoresist layer 2. In this arrangement, most of the solvent in the second photoresist layer 2 can be removed by the second pre-bake heating, then the adhesion of the photoresist in the second photoresist layer 2 is improved, and the exposure characteristics of the photoresist is fixed. In the method of pre-baking process, infrared radiation, oven, hot plate, etc. can be used, and the pre-baking time can be controlled between 50 seconds to 70 seconds. In one arrangement, the heating temperature of the second pre-bake heating may be 100-130 degrees so as to ensure the purpose of the second pre-bake heating.

According to one implementation of the present disclosure, after developing the first photoresist layer 1 and the second photoresist layer 2 to obtain a cathode isolation retaining wall 3 composed of the first isolation retaining wall portion 11 and the second isolation retaining wall portion 21, the method further includes: performing a post-baking heating on the cathode isolation retaining wall 3. In this arrangement, the residual solvent in the first photoresist layer 1 the second photoresist layer 2 after development can be removed by a post-baking process, at the same time, the adhesion and corrosion resistance of the photoresist in the cathode isolation retaining wall 3 are improved, in one arrangement, the heating temperature of the post-baking heating is 100-130 degrees, and the baking time may be 10-30 minutes.

In another aspect, an arrangement of the present disclosure provides a method for manufacturing a display panel, which includes:

exposing the first photoresist layer formed on the anode layer to obtain a first isolation retaining wall portion;

forming a second photoresist layer on a side of the first photoresist layer away from the anode layer, after exposing the second photoresist layer, a second isolation retaining wall portion at least partially stacked with the first isolation retaining wall portion is obtained. The first isolation retaining wall portion includes a first top surface attaching to the second isolation retaining wall portion, the second isolation retaining wall portion includes a second bottom surface attaching to the first isolation retaining wall portion, the orthographic projection of the first top surface on the anode layer falls within the orthographic projection of the second bottom surface on the anode layer;

developing the first photoresist layer and the second photoresist layer to obtain a cathode isolation retaining wall composed of the first isolation retaining wall portion and the second isolation retaining wall portion.

An arrangement of the present disclosure provides a method for manufacturing a display panel, to enable the cathode layer portion evaporated on the cathode isolation retaining wall and the cathode layer portion evaporated on the anode layer to be separated from each other, thus improving the cathode patterning effect. The above mentioned method for manufacturing cathode isolation retaining wall includes: firstly, exposing the first photoresist layer formed on the anode layer to obtain a first isolation retaining wall portion; secondly, forming a second photoresist layer on a side of the first photoresist layer away from the anode layer, after exposing the second photoresist layer, a second isolation retaining wall portion at least partially stacked with the first isolation retaining wall portion is obtained. The first isolation retaining wall portion includes a first top surface attaching to the second isolation retaining wall portion, the second isolation retaining wall portion includes a second bottom surface attaching to the first isolation retaining wall portion, the orthographic projection of the first top surface on the anode layer falls within the orthographic projection of the second bottom surface on the anode layer; lastly, developing the first photoresist layer and the second photoresist layer to obtain a cathode isolation retaining wall composed of the first isolation retaining wall portion and the second isolation retaining wall portion. According to the above, when the cathode layer is evaporated, a portion of the cathode layer may be formed on the anode layer between the adjacent two cathode isolation retaining walls, another portion of the cathode layer may be formed on the second isolation retaining wall portion, since the orthographic projection of the first top surface first isolation retaining wall portion on the anode layer falls within the orthographic projection of the second bottom surface of the second isolation retaining wall portion on the anode layer, therefore, in the height direction of the cathode isolation retaining wall, the second isolation retaining wall portion partially blocks the first isolation retaining wall portion, moreover, since the thickness of the cathode layer is smaller than the height of the first isolation retaining wall portion, the cathode layers of above two portions can't be continuously formed during the vapor deposition process, thus causing the cathode layer on the cathode isolation retaining wall and the cathode layer on the anode layer are separated and disconnected from each other, when different voltages are respectively input to the cathode layer portions separated and disconnected from each other, different display brightness can be formed at corresponding positions of the display panel, and the cathode patterning effect is improved.

Figure 6:
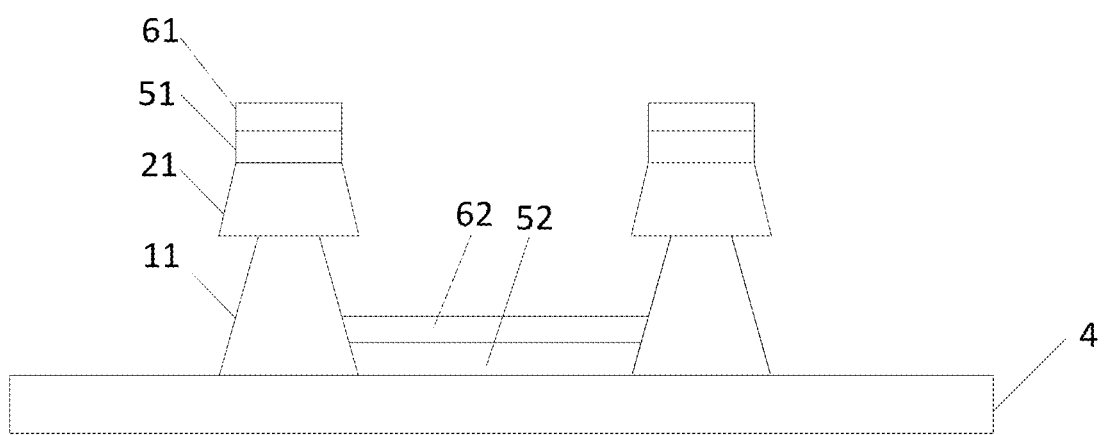
FIG. 6 is a schematic structure view of the display panel in one arrangement of the present disclosure.

In another aspect, as shown in FIG. 6, a display panel is provided by an arrangement of the present disclosure. The display panel includes an anode layer and a plurality of cathode isolation retaining walls, each of the cathode isolation retaining walls includes a first isolation retaining wall portion and a second isolation retaining wall portion stacked on the top of the first insulation retaining wall, the first isolation retaining wall portion is disposed on the anode layer, and the second isolation retaining wall is disposed on a side of the first isolation retaining wall portion away from the anode layer. The first isolation retaining wall portion includes a first top surface attaching to the second isolation retaining wall portion, the second isolation retaining wall portion includes a second bottom surface attaching to the first isolation retaining wall portion, the orthographic projection of the first top surface on the anode layer falls within the orthographic projection of the second bottom surface on the anode layer.

According to one implementation of the present disclosure, the first isolation retaining wall portion 11 and the second isolation retaining wall portion 12 are both made of a positive photoresist material. In this arrangement, after the positive photoresist being irradiated, the illuminated portion becomes easily dissolved, after development, the photoresist layer that is exposed after development will be dissolved, only leaving the illuminated portion to form the first isolation retaining wall portion 11 and the second isolation retaining wall portion 21, compared with the negative photoresist, the positive photoresist can make the display resolution higher because it is not easy to expand after absorbing the developer, in addition, since the negative photoresist is used less on the production line and the cost is relatively high, the use of the positive photoresist can not only make the process connection on the production line better, but also reduce the cost.

According to one implementation of the present disclosure, the height of the first isolation retaining wall portion 11 is greater than the height of the second isolation retaining wall portion 12. In this arrangement, in the process of the photolithography process, the first photoresist layer 1 is disposed on the lower side, and the second photoresist layer 2 is disposed on the upper side of the first photoresist layer 1, after the first photoresist layer 1 and the second photoresist layer 2 are exposed and developed, the formed second isolation retaining wall portion 21 is also disposed on the upper side of the first isolation retaining wall portion 11, moreover, since the first isolation retaining wall portion 11 is made of photoresist material which is soft, in order to prevent the second isolation retaining wall portion 21 from causing squeezing deformation of the first isolation retaining wall portion 11 under the influence of gravity, therefore, the height of the second isolation retaining wall portion 21 can be appropriately reduced so that the height of the second isolation retaining wall portion 21 is smaller than the height of the first isolation retaining wall portion 11, then reduce the weight of the second isolation retaining wall portion 21, thus reducing the deformation of the first isolation retaining wall portion.

According to one implementation of the present disclosure, There is a gap between two adjacent cathode isolation retaining walls 3, a first organic functional layer 51 and a first cathode layer 61 are sequentially disposed on each of the cathode isolation retaining walls 3, and a second organic functional layer 52 and a second cathode layer 62 are sequentially laid on the anode layer region between two adjacent cathode isolation retaining walls 3. The adjacent first cathode layer 61 and the second cathode layer 62 are separated from each other. In this arrangement, both the first cathode layer and the second cathode layer may be formed by evaporation, and the first organic functional layer and the second organic functional layer may also be formed by evaporation, when the anode layer and a cathode layer are energized, the organic functional layer between the cathode layer and the anode layer can realize the light-emitting function, since the plurality of first cathode layers and the plurality of second cathode layers are separated from each other, different voltages can be input between the different second cathode layers and the anode layer to achieve different brightness.

According to one implementation of the present disclosure, the plurality of second cathode layers 62 respectively correspond to a plurality of positions of the display panel, and the plurality of second cathode layers are used to load the touch signals. In this arrangement, the display panel may be a touch display panel, since the plurality of second cathode layers 62 respectively correspond to a plurality of positions of the display panel, when the finger touches the display panel, the human body can serves as a grounding terminal, and a capacitance between the second cathode layer 62 and the human body can be generated, when the finger is pressed on the display panel, the capacitance vale of the second cathode layer 62 to the ground of the corresponding position of the display panel is changed, and then the corresponding touch signal is output. However, in the related art, the cathode layer is laid on the anode layer as a whole piece, the touch can only output the same touch signal at any position, in order to realize the touch function, a touch film needs to be provided, compared with the related art, the arrangement does not need to provide a touch film on the display panel, thus saving cost.

An arrangement of the present disclosure provides a display panel, to enable the cathode layer portion evaporated on the cathode isolation retaining wall and the cathode layer portion evaporated on the anode layer to be separated from each other, thus improving the cathode patterning effect. The display panel includes: an anode layer and a plurality of cathode isolation retaining walls, each of the cathode isolation retaining walls includes a first isolation retaining wall portion and a second isolation retaining wall portion stacked on the top of the first isolation retaining wall portion, the first isolation retaining wall portion is disposed on the anode layer, and the second isolation retaining wall is disposed on a side of the first isolation retaining wall portion away from the anode layer. The first isolation retaining wall portion includes a first top surface attaching to the second isolation retaining wall portion, the second isolation retaining wall portion includes a second bottom surface attaching to the first isolation retaining wall portion, the orthographic projection of the first top surface on the anode layer falls within the orthographic projection of the second bottom surface on the anode layer. In the present disclosure, when the cathode layer is evaporated, a portion of the cathode layer may be formed on the anode layer between the adjacent two cathode isolation retaining walls, another portion of the cathode layer may be formed on the second isolation retaining wall portion, since the orthographic projection of the first top surface first isolation retaining wall portion on the anode layer falls within the orthographic projection of the second bottom surface of the second isolation retaining wall portion on the anode layer, therefore, in the height direction of the cathode isolation retaining wall, the second isolation retaining wall portion partially blocks the first isolation retaining wall portion, moreover, since the thickness of the cathode layer is smaller than the height of the first isolation retaining wall portion, the cathode layers of above two portions can't be continuously formed during the vapor deposition process, thus causing the cathode layer on the cathode isolation retaining wall and the cathode layer on the anode layer are separated and disconnected from each other, when different voltages are respectively input to the cathode layer portions separated and disconnected from each other, different display brightness can be formed at corresponding positions of the display panel, and the cathode patterning effect is improved.

The above description is only the specific arrangements disclosed in the present disclosure, but the protection scope disclosed by the present disclosure is not limited thereto, any changes or substitutions within the technical scope of the present disclosure may be easily thought by those skilled in the art are intended to be included within the protection scope of the present disclosure. Therefore, the protection of the disclosure should be determined by the scope of the claims.

What is claimed is:

1. A display panel, comprising:
   an anode layer and a plurality of cathode isolation retaining walls, each of the plurality of cathode isolation retaining walls comprising a first isolation retaining wall portion and a second isolation retaining wall portion stacked on the top of the first isolation retaining wall portion,
   wherein the first isolation retaining wall portion is disposed on the anode layer, and the second isolation retaining wall portion is disposed on a side of the first isolation retaining wall portion away from the anode layer,
   and wherein the first isolation retaining wall portion comprises a first top surface and a first bottom surface attaching to the anode layer, the second isolation retaining wall portion comprises a second bottom surface attaching to the first top surface of the first isolation retaining wall portion and a second top surface, and an orthographic projection of the first top surface of the first isolation retaining wall portion on the anode layer falls within an orthographic projection of the second bottom surface of the second isolation retaining wall portion on the anode layer.

2. The display panel according to claim 1, wherein the first isolation retaining wall portion and the second isolation retaining wall portion comprise positive photoresist.

3. The display panel according to claim 1, wherein an area of the first top surface is smaller than that of the first bottom surface, and an area of the second top surface is smaller than that of the second bottom surface.

4. The display panel according to claim 1, wherein a height of the first isolation retaining wall portion is greater than a height of the second isolation retaining wall portion.

5. The display panel according to claim 3, wherein:
   there is a gap between two adjacent ones of the plurality of cathode isolation retaining walls, a first organic functional layer and a first cathode layer are sequentially disposed on each of the plurality of cathode isolation retaining walls, and a second organic functional layer and a second cathode layer are sequentially laid on the anode layer region between two adjacent ones of the plurality of cathode isolation retaining walls, wherein the adjacent first cathode layer and the second cathode layer are separated from each other.

6. The display panel according to claim 5, wherein a plurality of the second cathode layers respectively correspond to a plurality of positions of the display panel, and the plurality of the second cathode layers are used for loading a touch signal.

7. A method for manufacturing a cathode isolation retaining wall, comprising:
   exposing a first photoresist layer formed on an anode layer to obtain a plurality of first isolation retaining wall portions;
   forming a second photoresist layer on a side of the first photoresist layer away from the anode layer and exposing the second photoresist layer to obtain a plurality of second isolation retaining wall portions, each of the plurality of second isolation retaining wall portions respectively being at least partially stacked with one of the plurality of first isolation retaining wall portions, wherein each of the plurality of first isolation retaining wall portions comprises a first top surface and a first bottom surface attaching to the anode layer, each of the plurality of second isolation retaining wall portions comprises a second bottom surface attaching to the first top surface of one of the plurality of first isolation retaining wall portions and a second top surface, and an orthographic projection of the first top surface of the first isolation retaining wall portion on the anode layer falls within an orthographic projection of the second bottom surface of the second isolation retaining wall portion on the anode layer;
   developing the first photoresist layer and the second photoresist layer to obtain a plurality of cathode isolation retaining walls, each of the plurality of cathode isolation retaining walls comprising a first isolation retaining wall portion and a second isolation retaining wall portion.

8. The method according to claim 7, wherein the first photoresist layer and the second photoresist layer are both positive photoresist.

9. The method according to claim 7, wherein an area of the first top surface is smaller than that of the first bottom surface, and an area of the second top surface is smaller than that of the second bottom surface.

10. The method according to claim 7, wherein a height of each of the plurality of first isolation retaining wall portions is greater than a height of each of the plurality of second isolation retaining wall portions.

11. The method according to claim 7, wherein each of the plurality of first isolation retaining wall portions has a height of 1-2 µm, and each of the plurality of second isolation retaining wall portions has a height of 0.5-1 µm.

12. The method according to claim 11, wherein the first bottom surface of each of the plurality of first isolation retaining wall portions has a width of 4-8 µm, and the second bottom surface of each of the plurality of second isolation retaining wall portions has a width of 6-10 µm.

13. A method for manufacturing a display panel, comprising:
   exposing a first photoresist layer formed on an anode layer to obtain a plurality of first isolation retaining wall portions;
   forming a second photoresist layer on a side of the first photoresist layer away from the anode layer, and exposing the second photoresist layer to obtain a plurality of second isolation retaining wall portions, each of the plurality of second isolation retaining wall portions respectively being at least partially stacked with one of the plurality of first isolation retaining wall portions, wherein each of the plurality of first isolation retaining wall portions comprises a first top surface and a first bottom surface attaching to the anode layer, each of the plurality of second isolation retaining wall portions comprises a second bottom surface attaching to the first top surface of one of the plurality of first insolation retaining wall portions and a second top surface, and an orthographic projection of the first top surface of the first isolation retaining wall portion on the anode layer falls within an orthographic projection of the second bottom surface of the second isolation retaining wall portion on the anode layer;

developing the first photoresist layer and the second photoresist layer to obtain a cathode isolation retaining wall composed of one of the plurality of first isolation retaining wall portions and one of the plurality of second isolation retaining wall portions.

14. The method according to claim 13, wherein the first photoresist layer and the second photoresist layer are both positive photoresist.

15. The method according to claim 14, wherein an area of the first top surface is smaller than that of the first bottom surface, and an area of the second top surface is smaller than that of the second bottom surface.

16. The method according to claim 13, wherein a height of each of the plurality of first isolation retaining wall portions is greater than a height of each of the plurality of second isolation retaining wall portions.

17. The method according to claim 13, wherein each of the plurality of first isolation retaining wall portions has a height of 1-2 μm, and each of the plurality of second isolation retaining wall portions has a height of 0.5-1 μm.

18. The method according to claim 17, wherein the first bottom surface of each of the plurality of first isolation retaining wall portions has a width of 4-8 μm, and the second bottom surface of each of the plurality of second isolation retaining wall portions has a width of 6-10 μm.

19. The display panel according to claim 1, wherein an area of the second bottom surface of the second isolation retaining wall portion is larger than that of the first top surface of the first isolation retaining wall portion.

20. The display panel according to claim 5, wherein the first organic functional layer comprises a third bottom surface attaching to the second top surface of the second isolation retaining wall portion, and an area of the third bottom surface of the first organic functional layer is the same as that of the second top surface of the second isolation retaining wall portion and larger than that of the first top surface of the first isolation retaining wall portion.

* * * * *